US006826073B2

(12) United States Patent
Liaw et al.

(10) Patent No.: US 6,826,073 B2
(45) Date of Patent: Nov. 30, 2004

(54) COMBINATION OF SRAM AND MROM CELLS

(75) Inventors: Shion-Hau Liaw, Hsinchu (TW); Li-Yeh Chen, Miaoli (TW)

(73) Assignee: Brilliance Semiconductor Inc., Hsin-Chu (TW)

( * ) Notice: Subject to any disclaimer, the term of this patent is extended or adjusted under 35 U.S.C. 154(b) by 0 days.

(21) Appl. No.: 10/608,527

(22) Filed: Jun. 30, 2003

(65) Prior Publication Data

US 2004/0004882 A1 Jan. 8, 2004

(30) Foreign Application Priority Data

Jul. 2, 2002 (TW) ........................................ 91114641 A

(51) Int. Cl.[7] .............................................. G11C 11/00
(52) U.S. Cl. .......................... 365/154; 365/94; 365/104
(58) Field of Search ................................ 365/154, 156, 365/104, 94

(56) References Cited

U.S. PATENT DOCUMENTS

| 5,365,475 A | * 11/1994 | Matsumura et al. ......... 365/154 |
| 5,923,582 A | * 7/1999 | Voss ............................ 365/154 |
| 6,041,008 A | * 3/2000 | Marr ........................ 365/225.7 |
| 6,128,218 A | * 10/2000 | You et al. .................... 365/156 |

* cited by examiner

*Primary Examiner*—Richard Elms
*Assistant Examiner*—Toan Le
(74) *Attorney, Agent, or Firm*—Birch, Stewart, Kolasch & Birch, LLP

(57) ABSTRACT

A new memory cell combination is disclosed. It includes a static random access memory (SRAM) unit and a mask read only memory (MROM) unit. The prior art separates the two memory units in different areas on a chip so that the circuit layout is not optimized. The disclosed cell combines them in the same area, saving more than 20% of the area.

18 Claims, 3 Drawing Sheets

COMBINATION OF SRAM AND MROM CELLS

This nonprovisional application claims priority under 35 U.S.C. §119(a) on Patent Application No(s). 91114641 filed in TAIWAN, R.O.C. on Jul. 2, 2002, which is(are) herein incorporated by reference.

BACKGROUND OF THE INVENTION

1. Field of Invention

The invention relates to a non-volatile static random access memory (SRAM) cell and, in particular, to a non-volatile SRAM cell that makes use of mask read only memory (MROM).

2. Related Art

There are two main type of memory: the volatile memory and the non-volatile memory. In the development history of non-volatile memory, the first proposed mask read only memory (MROM) first load programs or data into the photo mask used during the manufacturing process. Thus, they can permanently store data. The structure of its cell does not need to be manufactured using any special process. Moreover, there is no writing involved. Therefore, it is very economical and simple.

Nevertheless, there are the following problems to be solved. For instance, the time it takes for the memory to be made in the wafer fab and to be delivered to the customer is longer than other types of ROM (such as EPROM or EEPROM). This is mainly because the MROM is a configure-to-order (CTO) product. The fab starts preparing production only after receiving the memory codes sent from the customer.

On the other hand, the photo mask has to be manufactured according to the ROM asked by the customer. It is not finished until a certain chip process is done. Therefore, its cost for small-quantity production tends to be higher. Once the manufacturing is over, there is no way to modify its internal memory data. As a result, there are some risks for both the customer and the manufacturer.

Although there are the above-mentioned problems, the MROM still has its practical values. Driven by the needs for consuming electronics, memory of different specifications and types exist on the market. One of them is the non-volatile SRAM. The proposal of this type of technology is because the SRAM is volatile memory. Once if the power is turned off, the data stored there in disappear immediately. To compensate for this drawback, the non-volatile SRAM with memory properties becomes the modern trend.

Since electronic products such as PDA's and game machines are getting more compact, the chip area plays an important role. However, the prior art has the SRAM unit and the MROM cell on separate regions of a chip. Therefore, it is very inefficient. Thus, it is of great importance to provide a non-volatile SRAM cell with a smaller area.

SUMMARY OF THE INVENTION

An objective of the invention is to provide a new memory cell combination, including a SRAM unit and a MROM unit, for selectively being used as SRAM and ROM.

Another objective of the invention is to provide a SRAM cell with a smaller area. The active area where the source contact (Vss contact) is located extends to have a cross intersection area with the polysilicon area where access transistors are formed, constituting a MROM unit. Such a layout enables the word line to be shared between the Vss contact of the SRAM unit and the MROM. They can also be shared in the X-decoder circuit. One does not need to design the two unit circuits in two separate areas, saving the chip area by about 20%.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
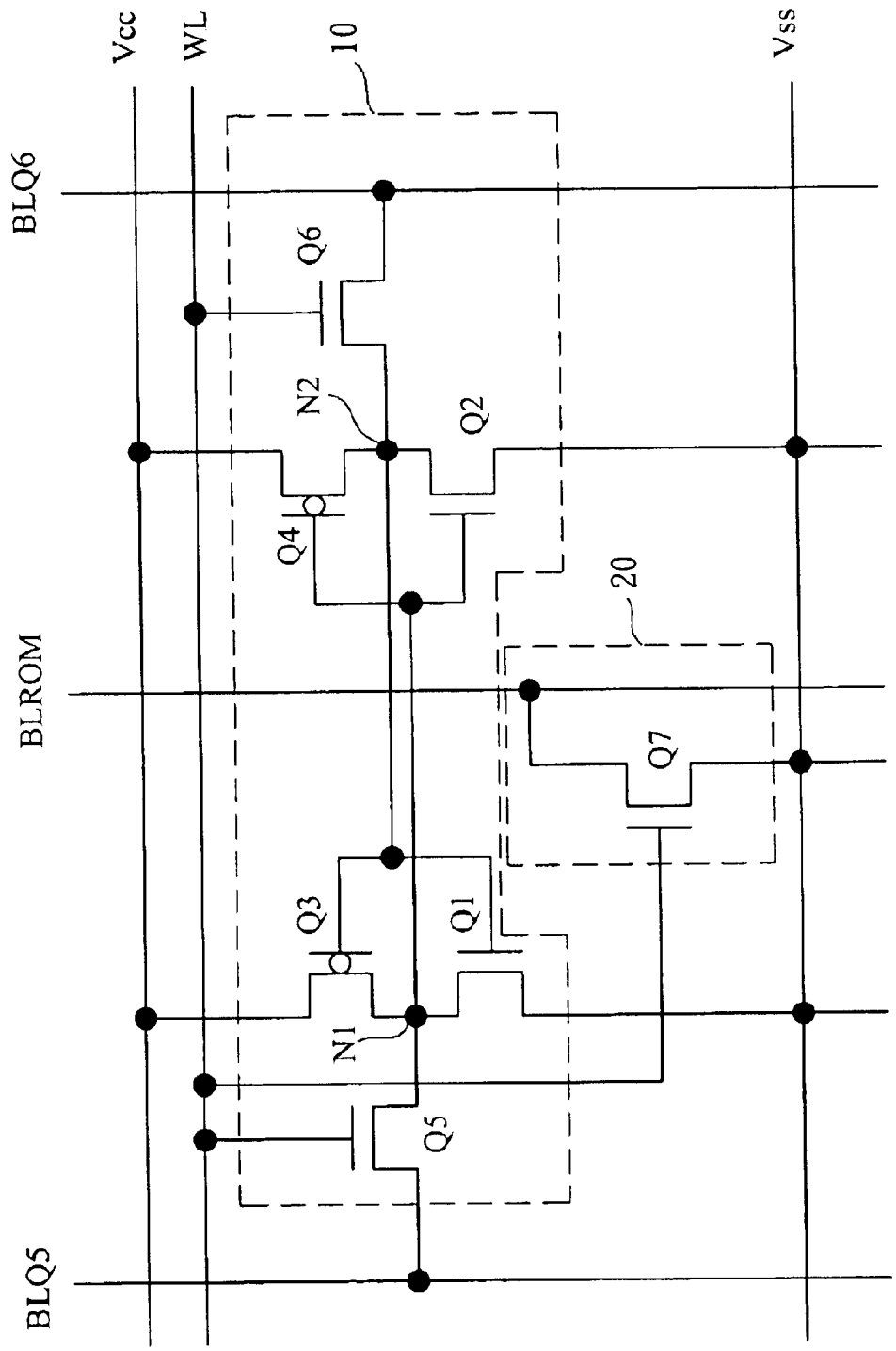
FIG. 1 is a circuit diagram of the non-volatile SRAM cell of the invention.

The memory cell disclosed by the invention is shown in FIG. 1. It includes a static random access unit (SRAM) unit 10 (hereinafter as SRAM cell) and a mask read only memory (MROM) unit 20 (hereinafter as MROM cell).

The SRAM cell 10 is a bit data memory structure for temporarily holding one bit of data. It provides the information to an operation environment at a later time according to the central processing unit (CPU) command.

As shown in the drawing, the SRAM cell 10 contains six transistors, the first transistor Q1, the second transistor Q2, the third transistor Q3, the fourth transistor Q4, the fifth transistor Q5, and the sixth transistor Q6, forming a six-transistor one-bit memory unit. A pair of CMOS inverters is connected into a flip flop. The memory nodes N1, N2 are connected to a pair of access transistors Q5, Q6, respectively, as the transmission gate. The gates of the fifth transistor Q5 and the sixth transistor Q6 are connected to a word line. Through the first transistor Q1, the second transistor Q2, the word line and a bit line perform data reading and writing. The third transistor Q3 and the fourth transistor Q4 are p-channel metal oxide semiconductor field effect transistors (pMOSFET's); while the first transistor Q1 and the second transistor Q2 are n-channel metal oxide semiconductor field effect transistors (nMOSFET's). The first transistor Q1 and the third transistor Q3, the second transistor Q2 and the fourth transistor Q4 form CMOS inverters, respectively.

The gates of the first transistor Q1 and the third transistor Q3 are connected to the drains of the second transistor Q2 and the fifth transistor Q5. The gates of the second transistor Q2 and the fourth transistor Q4 are connected to the drains of the first transistor Q1 and the third transistor Q3. The sources of the third transistor Q3 and the fourth transistor Q4 are connected to a power supply Vcc. The sources of the first transistor Q1 and the second transistor Q2 are connected to the ground Vss. When data 1 are latched in the SRAM cell 10, the second transistor Q2 is ON, the first transistor Q2 is OFF, the memory node N1 has the voltage Vcc, the memory node N2 has the voltage 0. When the first transistor Q1 is OFF while the second transistor is ON, it represents that there are data 1 stored in the SRAM cell 10.

The gates of the fifth transistor Q5 and the sixth transistor Q6 of the transmission gate are connected to the word line. Their drains are connected to the memory nodes N1 and N2. Their sources are connected to a first bit line BLQ5 and a first anti-bit line BLQ6. The fifth transistor Q5 and the sixth transistor Q6 function as switches. When they are ON, data can be sent out via the first bit line BLQ5 and the first anti-bit line BLQ6. Its state as ON and OFF is determined by the voltage signal on the word line WL. When the word line voltage is raised, the fifth transistor Q5 and the sixth transistor Q6 are opened. One bit of data is stored or sent out through the first bit line BLQ5 and the first anti-bit line BLQ6.

The MROM cell 20 contains a seventh transistor Q7, which is an nMOSFET with its gate connecting to the word line WL. Its drain is connected to a third bit line BLROM. The word line WL is shared by the fifth, sixth and seventh transistors Q5, Q6, Q7. When the voltage on the word line WL is raised, the SRAM cell 10 and the MROM cell 20 are selected. Using the bit lines, the combination can be selectively used as an SRAM cell or MROM cell for the CPU.

A primary objective of the invention is to combine the SRAM cell 10 and the MROM cell 20 into a single memory unit without increasing the cell area. As described above, the SRAM cell 10 and the MROM cell 20 share the same word line WL, saving the layout space of the seventh transistor Q7. We describe in the following how to integrate the MROM cell 20 together with the SRAM cell 10 without increasing the area.

Figure 2:
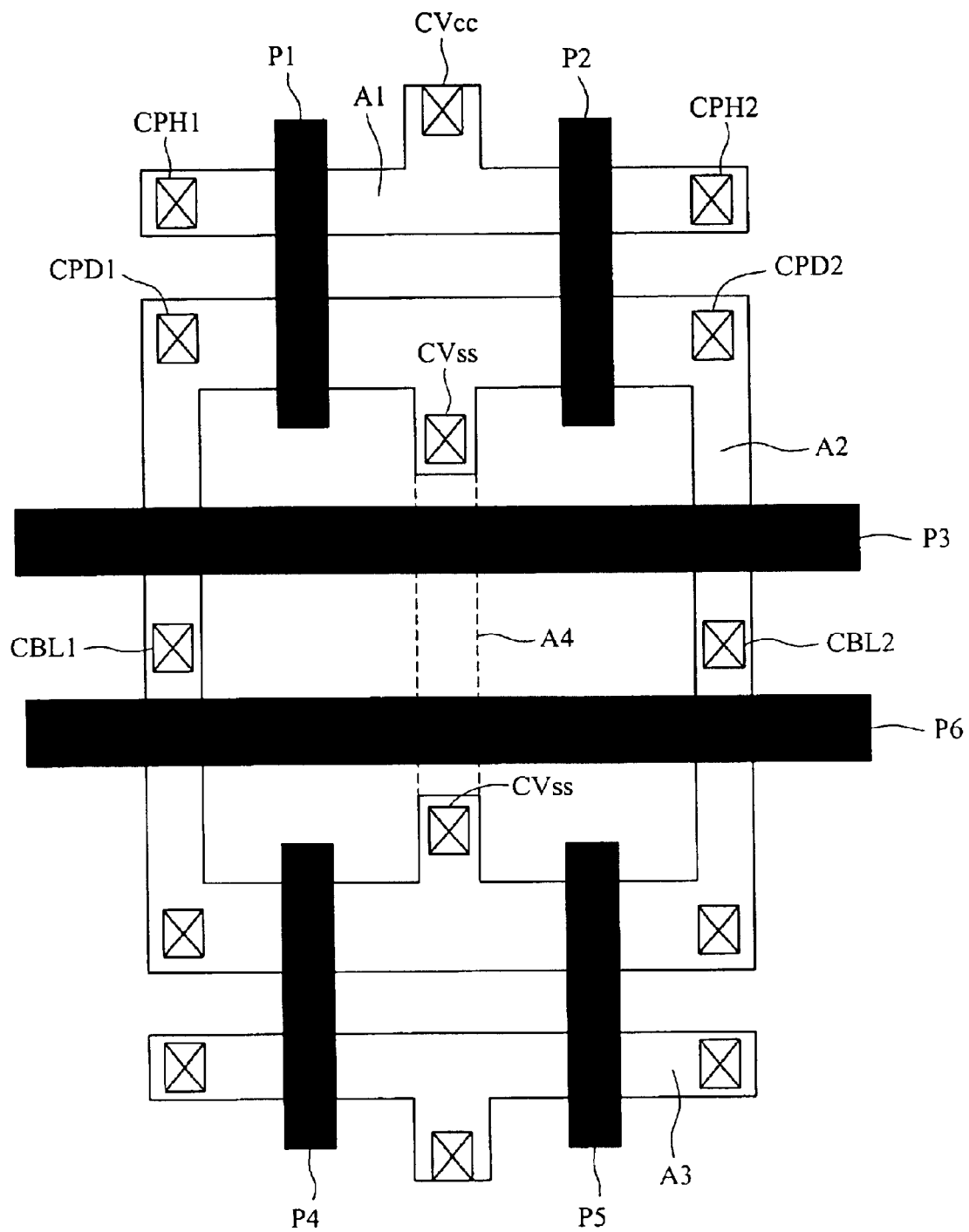
FIG. 2 is a schematic circuit layout of a conventional SRAM cell.

FIG. 2 shows the circuit layout of a conventional SRAM cell. There is a first active area A1 in the shape of an inversed T, a second active area A2 comprised of two E-shape regions, and a third active area A3 also in the shape of an inversed T. It further has a first polysilicon area P1, a second polysilicon area P3, and a third polysilicon area P3. The first polysilicon area P1, the second polysilicon area P2, the first active area A1, and a second active area A2 form four cross intersection areas for four transistors. They are the first transistor Q1, the second transistor Q2, the third transistor Q3, and the fourth transistor Q4 in FIG. 1. In particular, the first transistor Q1 and the second transistor Q2 are nMOSFET's, the third transistor Q3 and the fourth transistor Q4 are pMOSFET's.

The protruding part of the T-shape first active area A1 has a first Vcc contact CVcc. The protruding part of the E-shape second active area A2 has a second Vss contact CVss. The third contact CPH1 and the fourth contact CPH2 are up-pulling contacts on both sides of the T area. The fifth contact CPD1 and the sixth contact CPD2 are down-pulling contacts on both sides of the E area. The second active area A2 and the third polysilicon area P3 overlap to form two cross intersection areas; they are the fifth transistor Q5 and the sixth transistor Q6 in FIG. 1.

The lower part of FIG. 2 has a fourth polysilicon area P4, a fifth polysilicon area P5, and a sixth polysilicon area P6. They form six cross intersection areas with the second active area A2 and the third active area A3. The six cross intersection areas are six transistors for another SRAM cell. The third polysilicon area P3 and the sixth polysilicon area P6 cross the second active area A2. The third polysilicon area P3 and the sixth polysilicon area P6 do not overlap and leave a blank gap. There is a first bit line contact CBL1 and a second bit line contact CBL2 in the layout. This configuration forms two basic SRAM units.

Taking a closer look at FIG. 2, one can discover that the third polysilicon area P3 and the sixth polysilicon area P6 are not connected at the places close to the second contact CVss, leaving a blank area A4. The invention utilizes this blank area to put another ROM unit.

Figure 3:
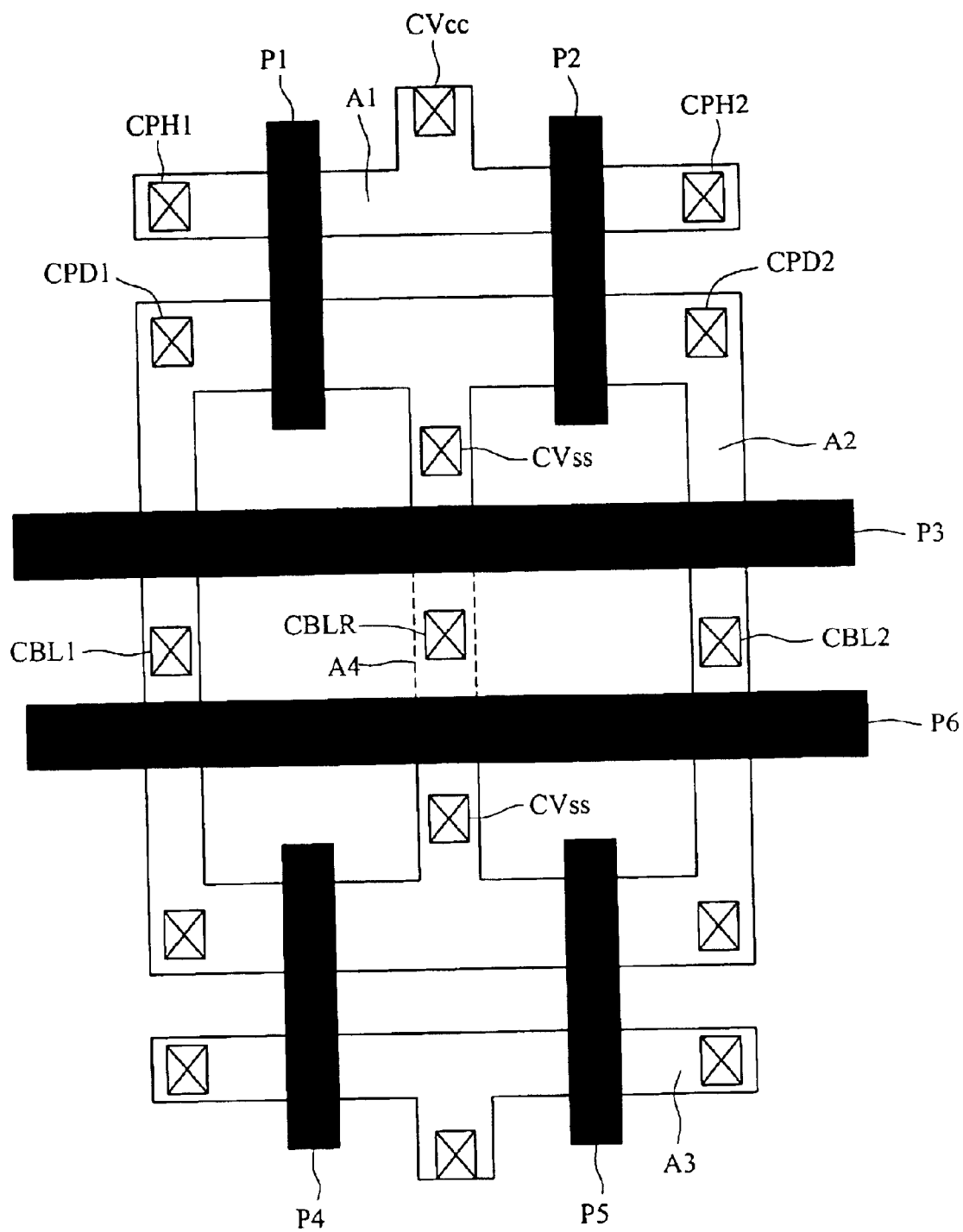
FIG. 3 is a schematic circuit layout of the disclosed non-volatile SRAM cell.

The invention extends the active area at the second contact CVss to the third polysilicon area P3 and the sixth polysilicon area P6 and makes them cross to form two transistors, as shown in FIG. 3. The extending part at the second contact CVss of the third polysilicon area P3 and the second active area A2 constitutes a ROM unit. The sixth polysilicon area P6 and the second active area A2 also form another ROM unit. The bit line contact of the ROM units are located at the intersection of the protruding parts of the second contacts CVss, the bit line contact CBLR in FIG. 3.

As described above, such a layout can embed ROM units inside the SRAM unit, effectively using the available area inside the SRAM. The word line can be shared to reduce the chip area by at least 20% than the prior art.

Certain variations would be apparent to those skilled in the art, which variations are considered within the spirit and scope of the claimed invention.

What is claimed is:

1. A combination of static random access memory (SRAM) and mask read only memory (MROM) cells, including a SRAM unit and a ROM unit, wherein the static random access unit as a random access memory unit comprises a first transistor, a second transistor, a third transistor, a fourth transistor, a fifth transistor, and a sixth transistor; the first transistor, the second transistor, the third transistor, and the fourth transistor forming an inverter; the first transistor being complementary to the third transistor, the second transistor being complementary to the fourth transistor, which is characterized in that:

the ROM unit being a MROM is used to permanently store data and has a seventh transistor, with the feature that the ROM unit is embedded inside the SRAM unit, the ROM unit is in a cross region formed by an intersection of a polysilicon area and a source Vss of the fifth transistor and the sixth transistor with a ROM bit line contact next to the ROM unit.

2. The memory cell combination of claim 1, wherein the first transistor, the second transistor, the third transistor, the fourth transistor, the fifth transistor, the sixth transistor, and the seventh transistor are metal oxide semiconductor field effect transistors (MOSFET's).

3. The memory cell combination of claim 1, wherein the SRAM unit and the ROM unit share the same word line.

4. The memory cell combination of claim 1, wherein the SRAM unit and the ROM unit share the same source (Vss) contact.

5. The memory cell combination of claim 1, wherein the SRAM unit and the ROM unit share the same X-decoder circuit.

6. A combination of static random access memory (SRAN) and mask read only memory (MROM) cells, including a SRAM unit and a ROM unit, wherein the static random access unit as a random access memory unit comprises a first transistor, a second transistor, a third transistor, a fourth transistor, a fifth transistor, and a sixth transistor; the first transistor, the second transistor, the third transistor, and the fourth transistor forming an inverter; the first transistor being complementary to the third transistor, the second transistor being complementary to the fourth transistor, which is characterized in that:

the ROM unit being a MROM is used to permanently store data and has a seventh transistor, with the feature that the ROM unit is formed in a cross region formed at an intersection of an active area extension where a polysilicon area and a source contact of the fifth transistor and the sixth transistor are located, so that the ROM unit is embedded inside the SRAM unit.

7. The memory cell combination of claim 6, wherein the ROM bit line contact next to the ROM unit.

8. The memory cell combination of claim 6, wherein the SRAM unit and the ROM unit share the same word line.

9. The memory cell combination of claim 6, wherein the SRAM unit and the ROM unit share the same source (Vss) contact.

10. The memory cell combination of claim 6, wherein the SRAM unit and the ROM unit share the same X-decoder circuit.

11. A combination of static random access memory (SRAN) and mask read only memory (MROM) cells, comprising:
   a static random access unit, which has at least a first transistor, a second transistor, a third transistor, a fourth transistor, a fifth transistor, and a sixth transistor; wherein the first transistor, the second transistor, the third transistor, and the fourth transistor form an inverter, the first transistor is complementary to the third transistor, and the second transistor is complementary to the fourth transistor;
   a read only memory (ROM) unit, which has at least a seventh transistor;
   a first bit line, which is connected to the source/drain of the fifth transistor;
   a second anti-bit line, which is connected to the source/drain of the sixth transistor;
   a third bit line, which is connected to the source/drain of the seventh transistor; and
   a word line, which is connected to the gates of the fifth transistor, the sixth transistor and the seventh transistor for controlling the fifth transistor, the sixth transistor and the seventh transistor.

12. The memory cell combination of claim 11, wherein the ROM unit is formed in a cross region formed at an intersection of an active area extension where a polysilicon area and a source contact of the fifth transistor and the sixth transistor are located, so that the ROM unit is embedded inside the SRAM unit.

13. The memory cell combination of claim 11, wherein the ROM unit is a mask read only memory (MROM).

14. The memory cell combination of claim 11, wherein the first transistor, the second transistor, the third transistor, the fourth transistor, the fifth transistor, the sixth transistor, and the seventh transistor are metal oxide semiconductor field effect transistors (MOSFET's).

15. The memory cell combination of claim 11, wherein the ROM bit line contact next to the ROM unit.

16. The memory cell combination of claim 11, wherein the SRAM unit and the ROM unit share the same word line.

17. The memory cell combination of claim 11, wherein the SRAM unit and the ROM unit share the same source (Vss) contact.

18. The memory cell combination of claim 11, wherein the SRAM unit and the ROM unit share the same X-decoder circuit.

* * * * *